US008940634B2

(12) United States Patent
Engel et al.

(10) Patent No.: US 8,940,634 B2
(45) Date of Patent: Jan. 27, 2015

(54) OVERLAPPING CONTACTS FOR SEMICONDUCTOR DEVICE

(75) Inventors: Brett H. Engel, Hopewell Junction, NY (US); Lindsey Hall, Pleasant Valley, NY (US); David F. Hilscher, Hopewell Junction, NY (US); Randolph F. Knarr, Putnam Valley, NY (US); Steven R. Soss, Cornwall, NY (US); Jin Z. Wallner, Pleasant Valley, NY (US)

(73) Assignees: International Business Machines Corporation, Armonk, NY (US); GLOBALFOUNDRIES, Inc. (KY); STMicroelectronics, Inc., Coppell, TX (US)

( * ) Notice: Subject to any disclaimer, the term of this patent is extended or adjusted under 35 U.S.C. 154(b) by 70 days.

(21) Appl. No.: 13/171,657

(22) Filed: Jun. 29, 2011

(65) Prior Publication Data

US 2013/0001786 A1  Jan. 3, 2013

(51) Int. Cl.
 *H01L 23/528* (2006.01)
 *H01L 21/768* (2006.01)
 *H01L 23/522* (2006.01)

(52) U.S. Cl.
 CPC ........ *H01L 23/528* (2013.01); *H01L 21/76895* (2013.01); *H01L 23/5226* (2013.01); *H01L 21/76816* (2013.01)
 USPC ........... 438/629; 438/637; 438/639; 438/640; 257/774; 257/775; 257/776; 257/764

(58) Field of Classification Search
 USPC ......... 257/773, 774, 735, 734, 775, 776, 781, 257/638; 438/15, 620, 629, 637, 639, 640
 See application file for complete search history.

(56) References Cited

U.S. PATENT DOCUMENTS

| 4,200,970 | A | | 5/1980 | Schonberger |
| 5,270,236 | A | | 12/1993 | Rosner |
| 5,334,862 | A | * | 8/1994 | Manning et al. ................ 257/67 |
| 5,480,837 | A | | 1/1996 | Liaw et al. |
| 5,879,985 | A | * | 3/1999 | Gambino et al. ............. 438/253 |
| 6,429,487 | B1 | * | 8/2002 | Kunikiyo ....................... 257/354 |
| 6,541,864 | B1 | * | 4/2003 | Fukuzumi ..................... 257/758 |
| 6,708,405 | B2 | * | 3/2004 | Hasler et al. .................... 29/852 |
| 6,780,762 | B2 | * | 8/2004 | Ireland .......................... 438/640 |
| 7,119,013 | B2 | | 10/2006 | Lee et al. |
| 7,888,761 | B2 | | 2/2011 | Meyer et al. |
| 7,989,957 | B2 | * | 8/2011 | Ireland .......................... 257/774 |
| 8,133,809 | B2 | * | 3/2012 | Mao .............................. 438/637 |
| 8,137,791 | B2 | * | 3/2012 | Anderson et al. ............. 428/173 |

(Continued)

OTHER PUBLICATIONS

U.S. Appl. No. 13/875,443, filed May 2, 2013; Non-Final Office Action mail date Aug. 21, 2013; pp. 1-11.

*Primary Examiner* — Olik Chaudhuri
*Assistant Examiner* — Charles N Ausar-El
(74) *Attorney, Agent, or Firm* — Cantor Colburn LLP; Yuanmin Cai

(57) ABSTRACT

A method of forming overlapping contacts in a semiconductor device includes forming a first contact in a dielectric layer; etching the dielectric layer to form a recess adjacent to the first contact and removing a top portion of the first contact while etching the dielectric layer, wherein a bottom portion of the first contact remains in the dielectric layer after the recess is formed in the dielectric layer; and forming a second contact in the recess adjacent to the bottom portion of the first contact and on top of a top surface of the bottom portion of the first contact.

12 Claims, 10 Drawing Sheets

(56) References Cited

U.S. PATENT DOCUMENTS

| | | | | |
|---|---|---|---|---|
| 8,786,087 B2* | 7/2014 | Harada | | 257/758 |
| 8,802,559 B2* | 8/2014 | Yang et al. | | 438/627 |
| 8,803,324 B2* | 8/2014 | Lee | | 257/774 |
| 2004/0102036 A1* | 5/2004 | Trivedi et al. | | 438/655 |
| 2004/0106276 A1* | 6/2004 | Deboer et al. | | 438/622 |
| 2004/0256733 A1* | 12/2004 | Matsuno et al. | | 257/774 |
| 2005/0090055 A1* | 4/2005 | Lee et al. | | 438/256 |
| 2006/0027840 A1* | 2/2006 | Wohlmuth | | 257/267 |
| 2008/0042291 A1 | 2/2008 | Knarr et al. | | |
| 2010/0096672 A1* | 4/2010 | Ireland | | 257/208 |
| 2010/0301490 A1 | 12/2010 | Simin et al. | | |
| 2013/0001789 A1* | 1/2013 | Yang et al. | | 257/769 |
| 2014/0148004 A1* | 5/2014 | Jang | | 438/620 |

* cited by examiner

OVERLAPPING CONTACTS FOR SEMICONDUCTOR DEVICE

BACKGROUND

This disclosure relates generally to the field of semiconductor device fabrication, and more particularly to formation of overlapping contacts (or interconnects) for a semiconductor device.

A semiconductor device may include co-planar adjacent contacts that are formed consecutively, during different processing steps. The subsequently formed contacts may need to be electrically connected with one another. FIG. 1 shows a cross-section of an example semiconductor device 100 having an adjacent first contact 102a and second contact 102b according to the prior art. First contact 102a and second contact 102b are formed during different processing steps, i.e., second contact 102b is formed after first contact 102a. First contact 102a and second contact 102b are located adjacent to one another in a dielectric layer 101 which may include an oxide or a nitride. Both the first contact 102a and the second contact 102b include a liner, in this case including a first liner layer 103 and second liner layer 104, and a contact fill metal 105. Electrical connection between the first contact 102a and the second contact 102b only exists at a contact interface 106 at the contact sidewalls. The electrical connection between the first contact 102a and the second contact 102b at contact interface 106 may be poor, as the contact interface 106 has a relatively small area, and may be resistive, as the electrical connection occurs across the liner barriers.

BRIEF SUMMARY

In one aspect, a method of forming overlapping contacts in a semiconductor device includes forming a first contact in a dielectric layer; etching the dielectric layer to form a recess adjacent to the first contact and removing a top portion of the first contact while etching the dielectric layer, wherein a bottom portion of the first contact remains in the dielectric layer after the recess is formed in the dielectric layer; and forming a second contact in the recess adjacent to the bottom portion of the first contact and on top of a top surface of the bottom portion of the first contact.

In another aspect, a semiconductor device with overlapping contacts includes a dielectric layer; a first contact located in the dielectric layer; and a second contact located in the dielectric layer adjacent to the first contact, wherein a portion of the second contact overlaps a top surface of the first contact.

In another aspect, a method of forming overlapping contacts in a semiconductor device includes forming a first contact in a dielectric layer; etching the dielectric layer to form a recess adjacent to the first contact and removing a top portion of the first contact while etching the dielectric layer, wherein a bottom portion of the first contact remains in the dielectric layer after the recess is formed in the dielectric layer, and wherein the recess completely surrounds the first contact; removing an additional top portion of the bottom portion of the first contact using an agitated physical cleaning; and forming a second contact in the recess adjacent to the bottom portion of the first contact and on top of a top surface of the bottom portion of the first contact.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES:

FIGS. 3 through 5 are a series of cross sectional views illustrating an embodiment of the method of FIG. 3 for formation of overlapping first and second contacts in which:

FIG. 3 illustrates the formation of a first contact.

FIG. 4 illustrates the device of FIG. 3 after etching a recess for a second contact and removing a top portion of the first contact.

FIG. 5 illustrates the device of FIG. 4 after formation of the second contact in the recess and over the top surface of the etched first contact.

FIGS. 7 through 10 are a series of cross sectional views illustrating another embodiment of the method of FIG. 6 for formation of overlapping first and second contacts in which:

FIG. 7 illustrates the formation of a first contact.

FIG. 8 illustrates the device of FIG. 7 after etching a recess for a second contact and removing a top portion of the first contact.

FIG. 9 illustrates the device of FIG. 8 after removing an additional top portion of the etched first contact.

FIG. 10 illustrates the device of FIG. 9 after formation of the second contact in the recess and over the top surface of the partially removed first contact.

DETAILED DESCRIPTION

Embodiments of overlapping contacts (or interconnects) for a semiconductor device, and methods for forming overlapping contacts, are provided, with exemplary embodiments being discussed below in detail. The overlapping contacts are formed subsequently, during different processing steps. Physical means may be used to remove a top portion of the first contact before formation of the second contact. A portion of the second contact may then be formed on a top surface of the partially removed first contact such that the second contact overlaps the first contact. This results in a relatively large contact interface are between the first and second contacts, and gives a correspondingly improved electrical connection between the first and second contacts. Partial removal of the first contact may be accomplished by etching, or by etching in conjunction with an agitated physical clean in various embodiments. Overlapping contacts may be used in many types of electrical devices, including but not limited to static random access memory (SRAM), and for connections including but not limited to logical cross-couples or power rails.

Figure 1:
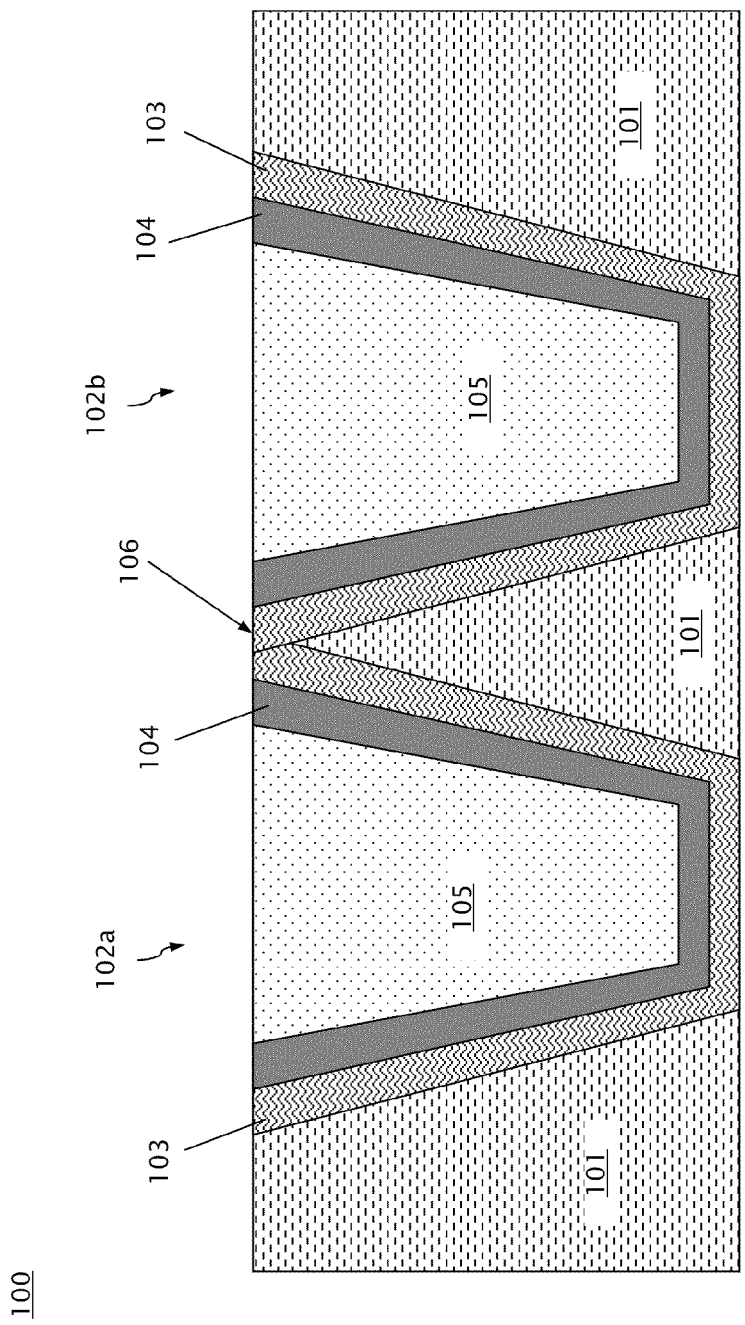
FIG. 1 is a cross sectional view of existing first and second contacts formed in a semiconductor device.
Figure 2:
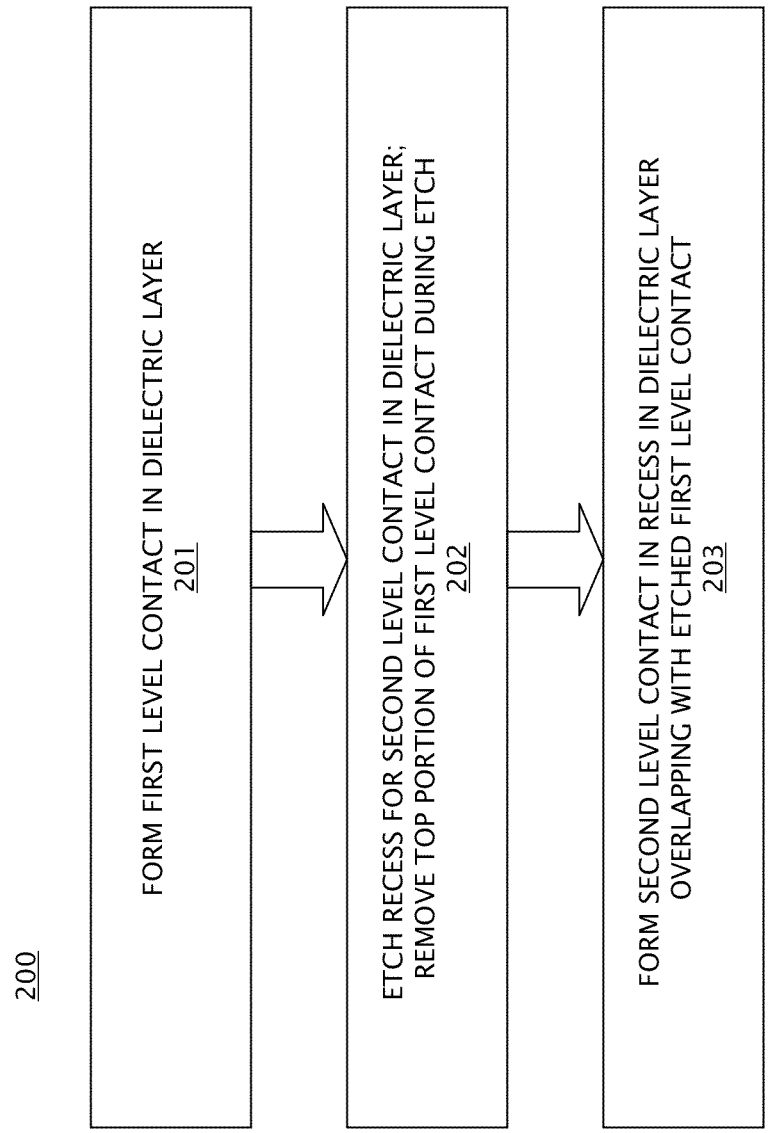
FIG. 2 is a flowchart illustrating an embodiment of a method for formation of overlapping first and second contacts.
Figure 3:
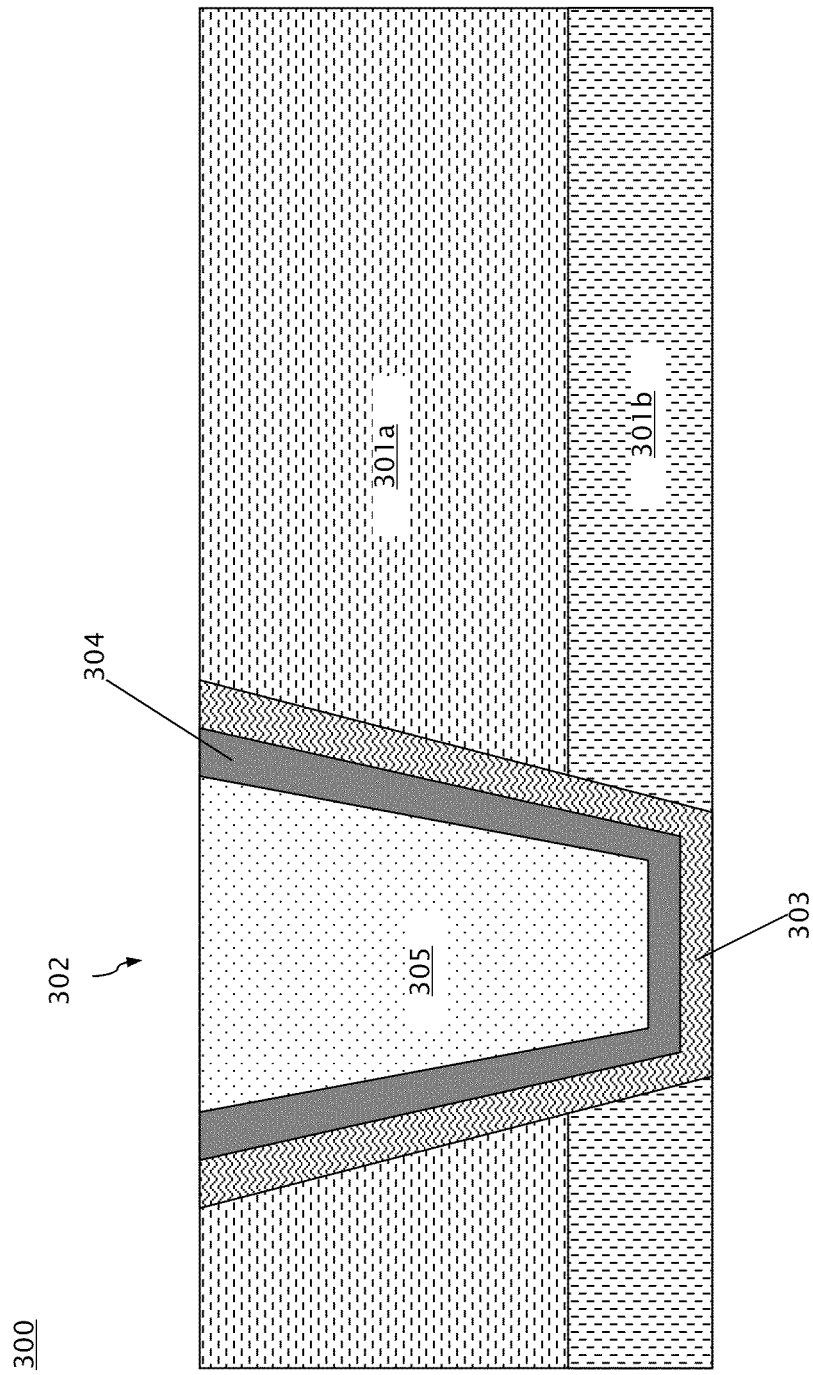

Turning to FIG. 2, a flowchart of an embodiment of a method 200 for formation of overlapping first and second contacts is shown. In block 201, a first contact, as shown in FIG. 3, is formed. The first contact 302 is formed in a dielectric layer 301a-b. The first contact 302 includes a liner, including outer liner layer 303 and inner liner layer 304, and a contact fill metal 305. Contact fill metal 305 may be, for example, tungsten. Outer liner layer 303 may be, for example, titanium nitride, and the inner liner layer 304 may be, for example, titanium. The dielectric layer 301*a-b* may include, for example, a nitride or an oxide. In the exemplary embodiment shown in FIG. 3, the dielectric layer includes top dielectric layer 301*a* and bottom dielectric layer 301*b* comprising different dielectric materials; in other embodiments, the dielectric layer may include a single dielectric material.

Figure 4:
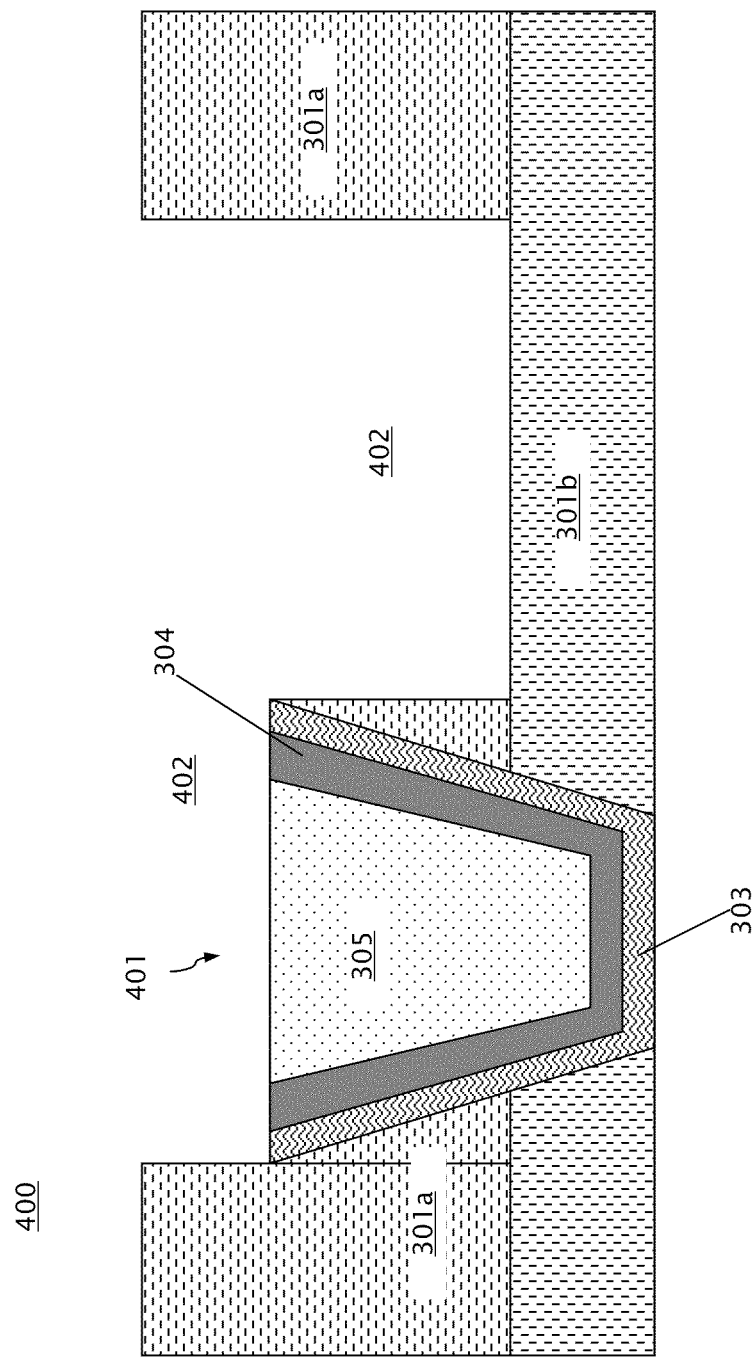

In block 202 of FIG. 2, a recess is formed in the dielectric layer, and a top portion of first contact 302 is removed. Recess formation and partial removal (or pullback) of first contact 302 may be performed by etching. As shown in FIG. 4, the etch process performed in block 202 of FIG. 2 forms a recess 402 in the dielectric layer 301*a-b*, and also removes a top portion of the first contact 302, resulting in an etched first contact 401. In an exemplary embodiment, the etch process may include reactive ion etching (RIE) or wet etching. In embodiments in which the dielectric layer 301*a-b* includes top dielectric layer 301*a* and bottom dielectric layer 301*b* comprising different dielectric materials, the recess 402 may be formed in the top dielectric layer 301*a*, such that the interface between the top dielectric layer 301*a* and bottom dielectric layer 301*b* serves as an etch stop during the etch that forms the recess 402, thereby determining the depth of the recess 402 in dielectric layer 301*a-b*. In such an embodiment, the bottom of recess 402 is therefore located at the top of the bottom dielectric layer 301*b*, as shown in FIG. 4.

Figure 5:
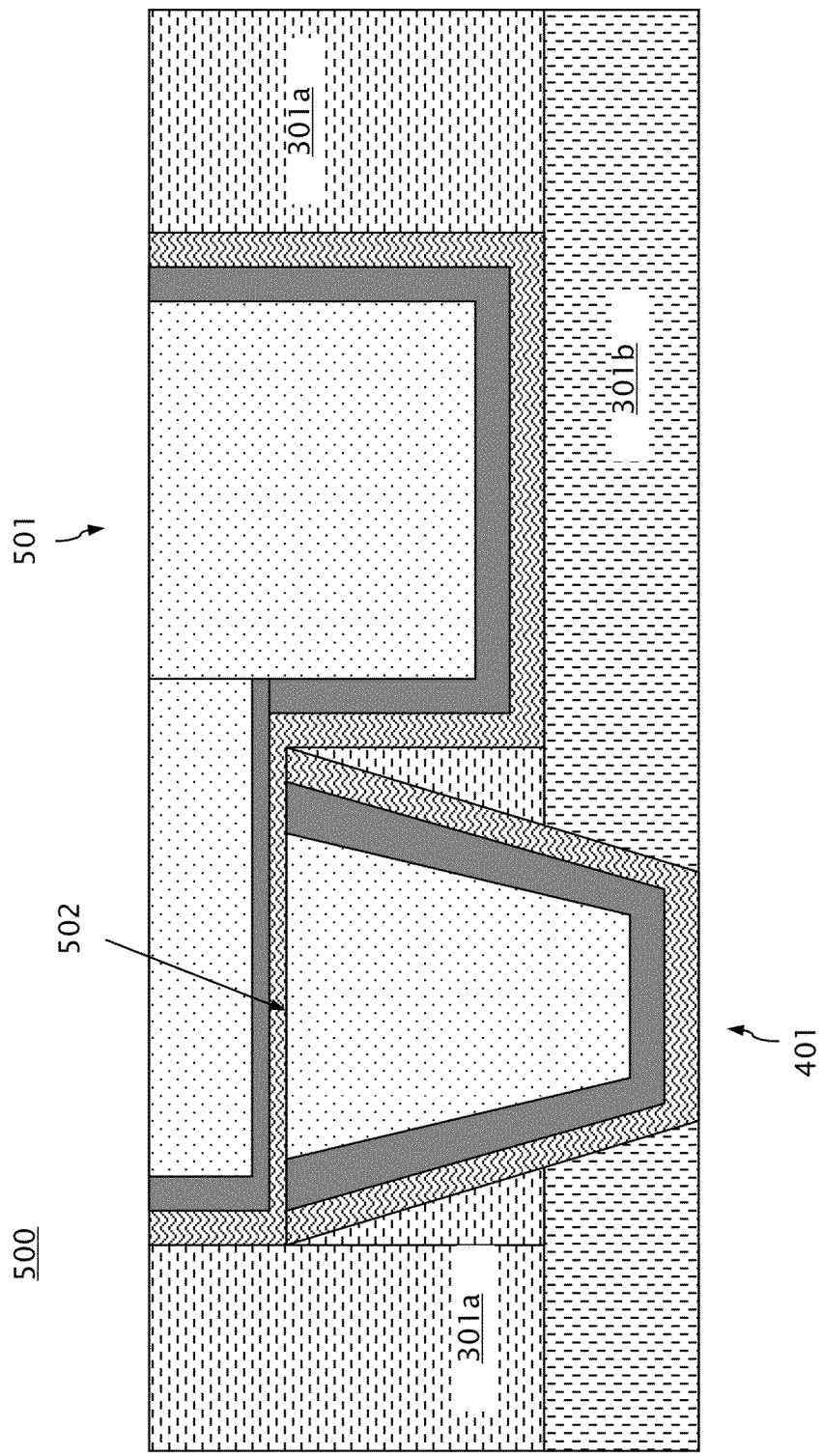

Lastly, in block 203 of FIG. 2, a second contact 501 is formed adjacent to and on a top surface of the etched first contact 401, as shown in FIG. 5. Second contact 501 may comprise outer and inner liner layers and a contact fill metal such as are described above with respect to first contact 302 in the section discussing block 201. At least a portion of the second contact 501 is located directly on top of the etched first contact 401, such that contacts 401 and 501 overlap, and the outer liner layer of second contact 501 is in contact with the fill metal on the top surface of the first contact 401 along contact interface 502. Contacts 401 and 501 are electrically connected along a contact interface 502 at the top surface of first contact 401, which provides a relatively large contact interface area, in turn allowing a good electrical connection between contacts 401 and 501. After the formation of second contact 501, the device 500 may be polished using, for example, chemical mechanical polishing (CMP).

Figure 6:
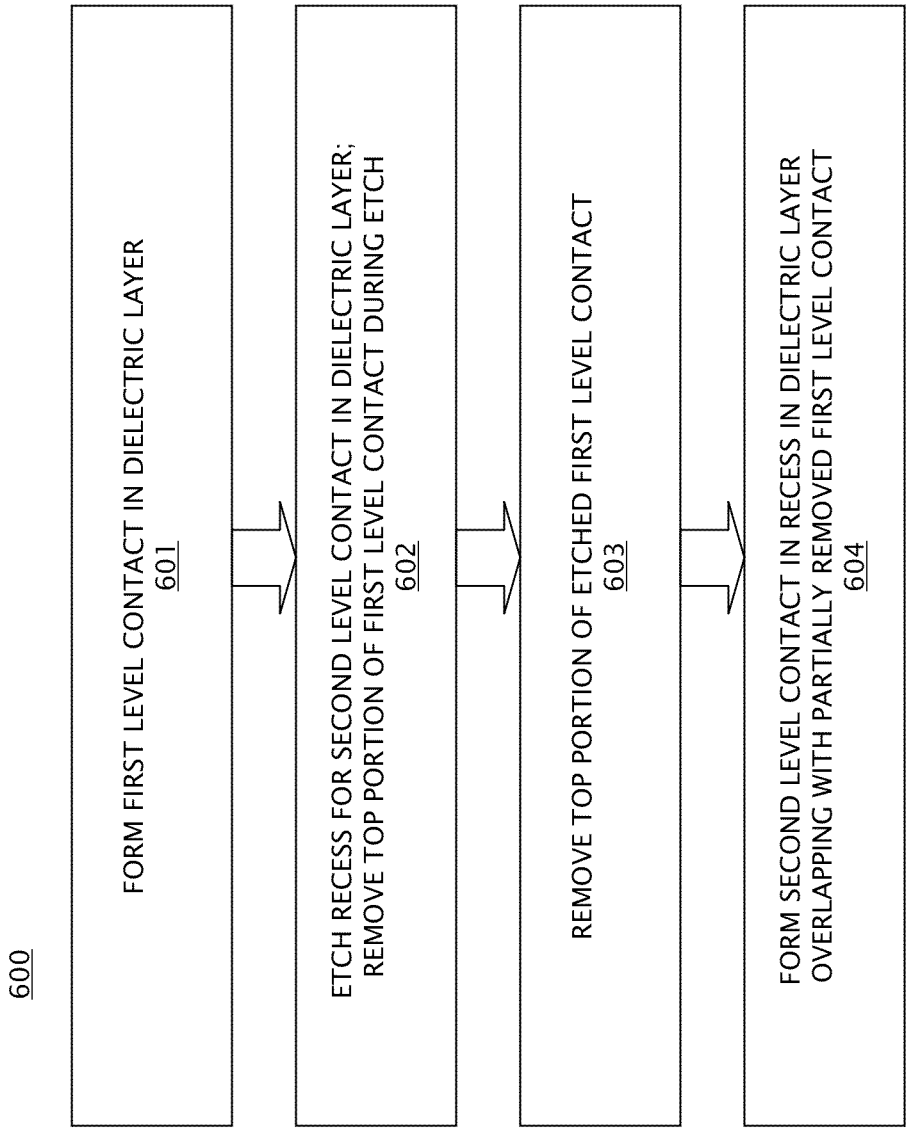
FIG. 6 is a flowchart illustrating another embodiment of a method for formation of overlapping first and second contacts.
Figure 7:
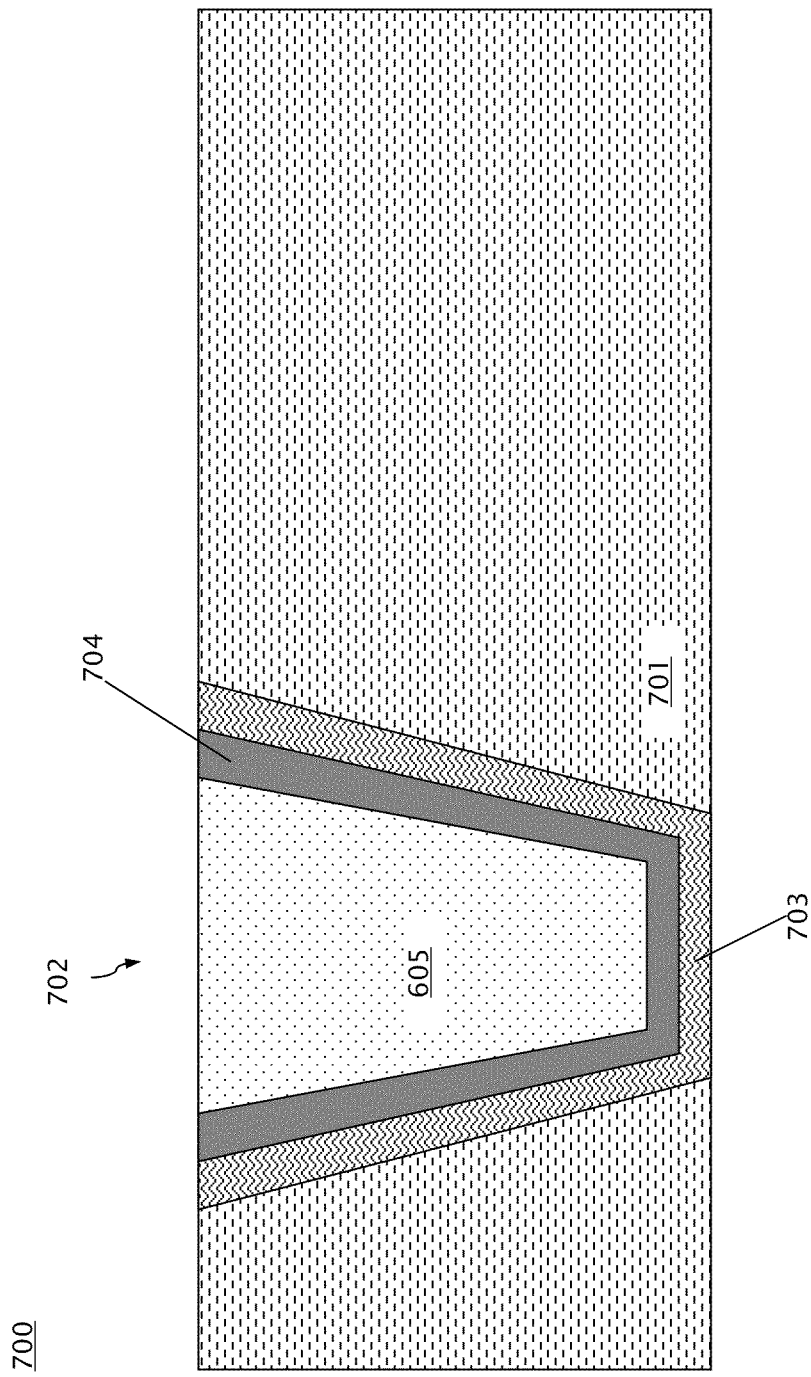

In a second embodiment of a method for formation of overlapping first and second contacts, which is illustrated in FIG. 6, partial removal of the first contact is a two-step process, including an additional partial removal step that is performed in after the etching is completed and the recess is formed. The recess may be formed such that a top portion of the partially removed first contact is completely surrounded by the recess, i.e., is not anchored in the dielectric. The additional partial removal step includes an aggressive agitated physical clean such as megasonics to physically knock down and remove a top portion of the partially removed first contact that is not anchored in the dielectric. Turning to FIG. 6, in block 601, a first contact, as shown in FIG. 7, is formed. The first contact 702 is formed in a dielectric layer 701. The first contact 702 includes contact fill metal 705 and a liner including outer liner layer 703 and inner liner layer 704. Contact fill metal 705 may be tungsten, for example. Outer liner layer 303 may be titanium nitride, for example, and inner liner layer 704 may be titanium, for example. The dielectric layer 701 may be a nitride or an oxide, and may include top and bottom dielectric layers comprising different dielectric materials in some embodiments (as described above with respect to dielectric layer 301*a-b*), or a single dielectric material in other embodiments.

Figure 8:
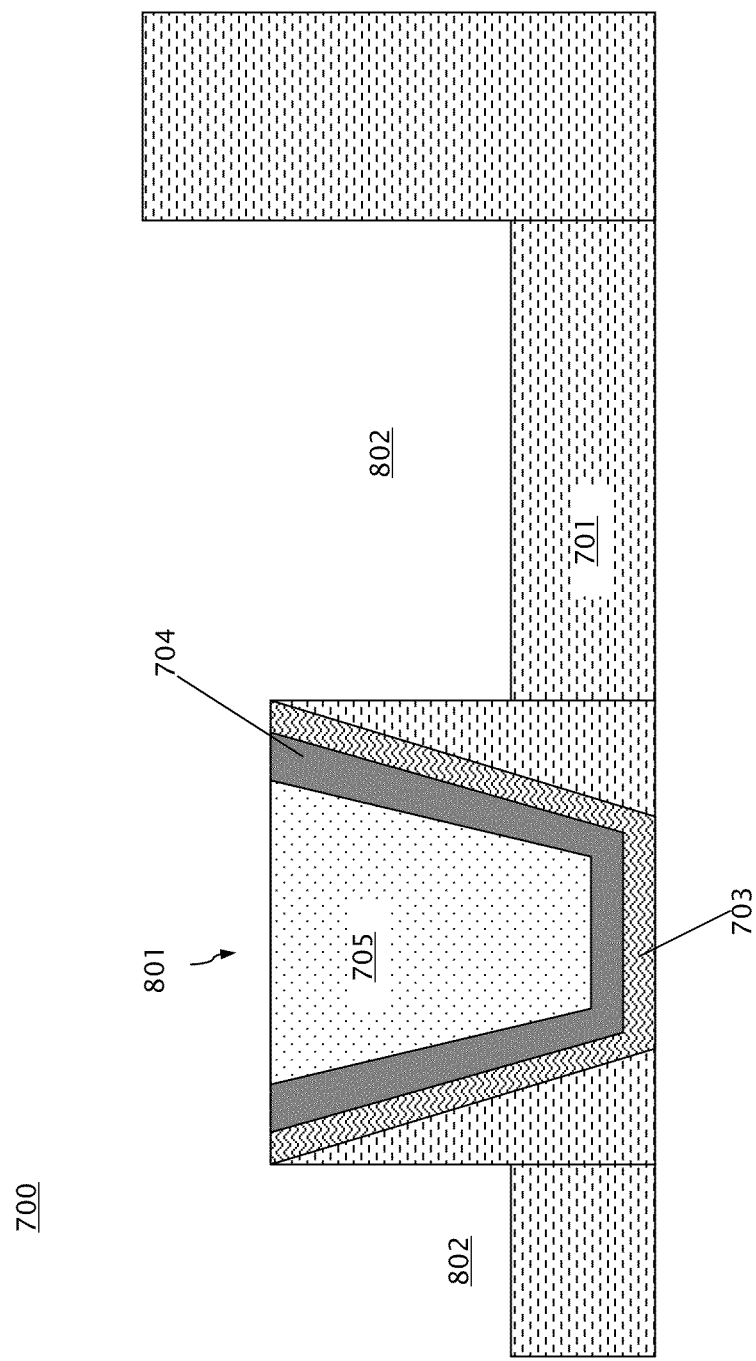

In block 602, a recess is etched in the dielectric, and a top portion of the first contact is removed during the etch. As shown in FIG. 8, the etch performed in block 602 of FIG. 6 forms a recess 802 in the dielectric 701, and also removes a top portion of first contact 702, resulting in etched first contact 801. The etch may include RIE or wet etching. Recess 802 is formed all around the etched first contact 801, such that an upper portion of the etched first contact 801 is not anchored in the dielectric 701.

Figure 9:
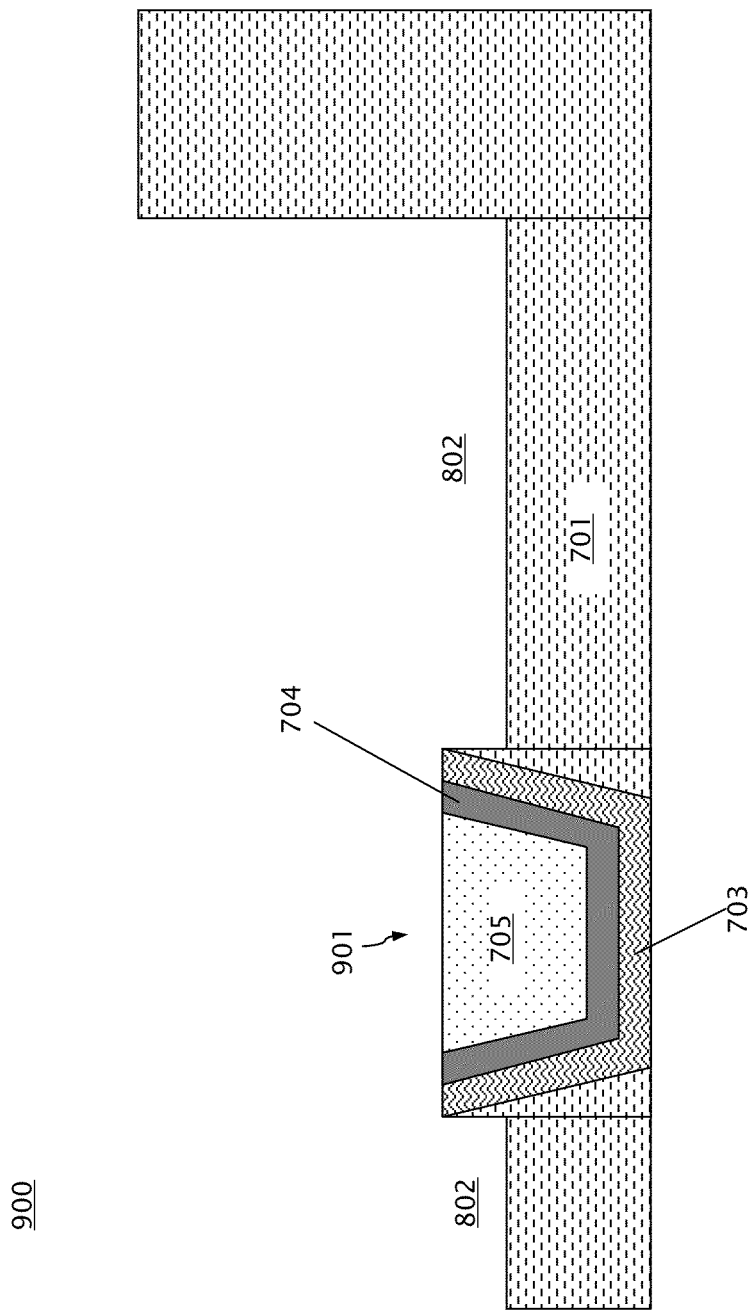

Then, in block 603 of FIG. 6, an additional top portion of etched first contact 801 is removed, resulting in partially removed first contact 901 shown in FIG. 9. Removal of the additional top portion of the contact may allow for a longer contact interface between the first contact and the second contact (discussed below with respect to block 604 of FIG. 6). Any appropriate amount of the etched first contact 801 may be removed during the additional contact removal step of block 603 of FIG. 6; some or all of the top portion of the first contact 801 that is not anchored in the dielectric 701 may be removed. In some embodiments, the top of partially removed first contact 901 may be approximately even with the surface of dielectric 701 after the additional partial contact removal step of block 603 of FIG. 6. The additional partial contact removal may include an aggressive agitated physical clean of the top surface of the etched first contact 801. The agitated physical clean may include megasonics, ultrasonics, cryogenic aerosol, or a pressurized and atomized liquid in various embodiments. In the ultrasonics and megasonics techniques, energy is applied to a liquid solution that is placed on the surface being cleaned, causing microbubbles to form in the liquid solution (referred to as a cavitation event). When the microbubbles collapse, the energy from the collapse is transferred to the surface, resulting in the removal of surface particles or patterning of damage-sensitive portions of the surface. Cryogenic aerosols are another physical method of creating intentional pattern damage on a surface. In the cryogenic aerosol technique, a surface is bombarded with an aerosol mixture, which may include argon (Ar), nitritrogen gas ($N_2$) and/or carbon dioxide ($CO_2$) mixtures. The aerosol mixture vaporizes when it hits the surface. The combination of physical bombardment by the aerosol mixture coupled with the sublimation phase change of the aerosol mixture that occurs on the surface removes particles from or cause desired pattern damage to the surface. Atomized liquid droplets may also be used to cause pattern damage to a surface, with appropriate droplet size and pressure of the atomized liquid. Any of these approaches may be used to physically knock down and remove the upper portion of the etched first contact 801 that is not anchored in the dielectric 701.

Figure 10:
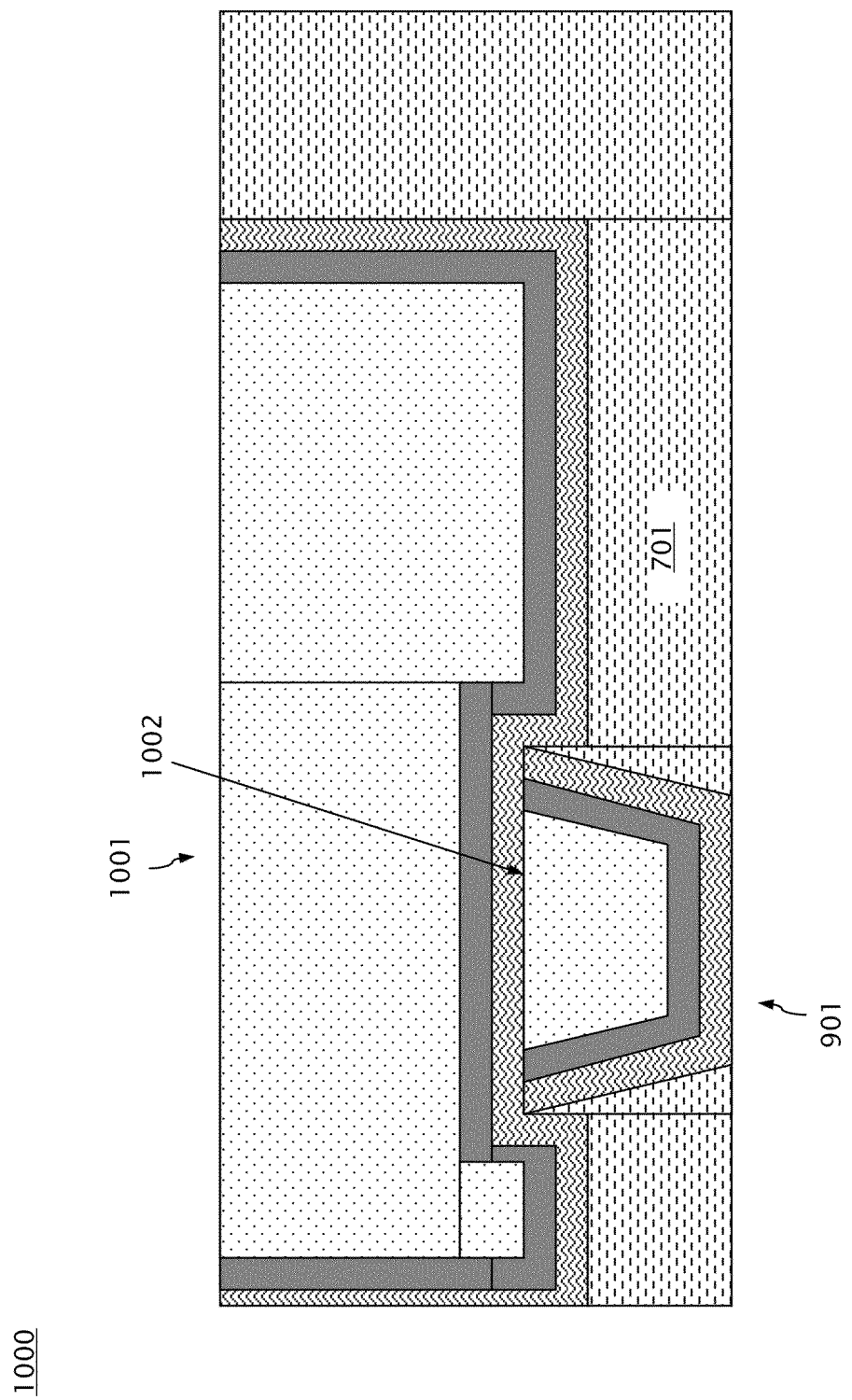

Lastly, in block 604 of FIG. 6, a second contact 1001 is formed over the top surface of the partially removed first contact 901, as shown in FIG. 10. Second contact 1001 may comprise outer and inner liner layers and a contact fill metal such as are described above with respect to first contact 702 in the section discussing block 601. Second contact 1001 completely covers partially removed first contact 901, such that contacts 901 and 1001 overlap, and the outer liner layer of second contact 1001 is in contact with the fill metal on the top surface of the first contact 901 along contact interface 1002. Contacts 901 and 1001 are electrically connected along contact interface 1002 at the top of first contact 901, which provides a relatively large contact surface area, allowing a good electrical connection between contacts 901 and 1001.

After formation of second contact 1001, the device 1000 may be polished using, for example, CMP.

The technical effects and benefits of exemplary embodiments include improvement of an electrical connection between two contacts formed during different processing steps by increasing the area of the interface between the two contacts.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method of forming overlapping contacts in a semiconductor device, the method comprising:
    forming a first contact in a dielectric layer;
    etching the dielectric layer, thus forming a recess adjacent to the first contact, and removing a top portion of the first contact by the etching of the dielectric layer while forming the recess in the dielectric layer, wherein a bottom portion of the first contact remains in the dielectric layer after the recess is formed in the dielectric layer, wherein the dielectric layer comprises a top dielectric layer and a bottom dielectric layer, the top dielectric layer and the bottom dielectric layer comprising different dielectric materials, the top dielectric layer being located directly on a top surface of the bottom dielectric layer such that an interface between the top dielectric layer and the bottom dielectric layer acts as an etch stop during the etching of the dielectric layer, such that the top surface of the bottom dielectric layer is exposed by the etching, and wherein the recess is formed in the top dielectric layer; and
    forming a second contact in the recess adjacent to the bottom portion of the first contact and directly on top of a top surface of the bottom portion of the first contact after removing the top portion of the first contact, wherein the second contact is formed in the recess directly on the top surface of the bottom dielectric layer that was exposed by the etching, such that the second contact does not extend below the top surface of the bottom dielectric layer.

2. The method of claim 1, wherein the recess completely surrounds the bottom portion of the first contact.

3. The method of claim 1, further comprising removing an additional top portion of the bottom portion of the first contact by a removal process that is distinct from the etching the dielectric layer, after removing the top portion of the first contact, and before forming the second contact overlapping the top surface of the bottom portion of the first contact.

4. The method of claim 3, wherein removing the additional top portion of the bottom portion of the first contact comprises agitated physical cleaning.

5. The method of claim 4, wherein the agitated physical cleaning comprises applying one of megasonics, ultrasonics, cryogenic aerosol, and a pressurized and atomized liquid in the cleaning.

6. The method of claim 1, wherein the second contact completely covers the top surface of the bottom portion of the first contact.

7. The method of claim 1, wherein the first contact comprises a liner, the liner comprising a first outer liner layer located adjacent to the dielectric layer, a first inner liner layer located over the first outer liner layer, and a first contact fill metal located over the first inner liner layer; and
    wherein the second contact comprises an second outer liner layer, wherein a first portion of the second outer liner layer is located adjacent to the dielectric layer, and a second portion of the second outer liner layer is located adjacent to the first contact fill metal on the top surface of the first contact, a second inner liner layer located over the second outer liner layer, and a second contact fill metal located over the second inner liner layer.

8. The method of claim 7, wherein the first and second outer liner layers comprise titanium, the first and second inner liner layers comprises titanium nitride, and the first and second contact fill metal comprises tungsten.

9. The method of claim 1, wherein etching the dielectric layer, thus forming the recess in the dielectric layer adjacent to the first contact, and removing a top portion of the first contact by the etching of the dielectric layer while forming the recess in the dielectric layer, comprises one of reactive ion etching (RIE) and wet etching.

10. The method of claim 1, wherein the top dielectric layer and the bottom dielectric layer each comprise one of an oxide material and a nitride material, such that the second contact is located directly adjacent to both the oxide material and the nitride material.

11. The method of claim 7, wherein a third portion of the second outer liner layer is located adjacent to the first outer liner layer and the first inner liner layer.

12. The method of claim 1, wherein the sides of the first contact are sloped, and wherein a portion of the dielectric layer is located between the bottom portion of the first contact and the second contact.

* * * * *